US012599020B2

(12) United States Patent
Wasserman et al.

(10) Patent No.: US 12,599,020 B2
(45) Date of Patent: Apr. 7, 2026

(54) ELECTRONIC COMPONENT BONDING MACHINES, AND METHODS OF MEASURING A DISTANCE ON SUCH MACHINES

(71) Applicant: Kulicke and Soffa Industries, Inc., Fort Washington, PA (US)

(72) Inventors: Matthew B. Wasserman, Fort Washington, PA (US); James E. Eder, Fort Washington, PA (US); Michael P. Schmidt-Lange, Fort Washington, PA (US); Matthew E. Tarabulski, Fort Washington, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 982 days.

(21) Appl. No.: 17/828,966

(22) Filed: May 31, 2022

(65) Prior Publication Data

US 2022/0384384 A1     Dec. 1, 2022

Related U.S. Application Data

(60) Provisional application No. 63/195,705, filed on Jun. 1, 2021.

(51) Int. Cl.
H05K 1/02 (2006.01)
H10W 72/00 (2026.01)

(52) U.S. Cl.
CPC .......... H10W 72/0711 (2026.01); H05K 1/02 (2013.01); H10W 72/072 (2026.01);
(Continued)

(58) Field of Classification Search
None
See application file for complete search history.

(56) References Cited

U.S. PATENT DOCUMENTS 5,461,472 A * 10/1995 Harvey .................. G01B 11/26
356/138
5,560,100 A * 10/1996 Englert .................... H05K 3/30
29/712
(Continued)

FOREIGN PATENT DOCUMENTS

JP          05-326633          12/1993
JP          2000-012623          1/2000
(Continued)

OTHER PUBLICATIONS

Joo et al.—Distance measurements by combined method based on femtosecond pulse laser, Optics Express, vol. 16, No. 24, 2008 (Year: 2008).*

(Continued)

*Primary Examiner* — Devang R Patel
(74) *Attorney, Agent, or Firm* — Christopher M. Spletzer, Sr.

(57) ABSTRACT

An electronic component bonding machine is provided. The electronic component bonding machine includes: a support structure for supporting a substrate; a bond head assembly for holding an electronic component, and for bonding the electronic component to the substrate; and a measuring system for measuring a distance between (i) an upper target on the electronic component bonding machine and (ii) a lower target on the electronic component bonding machine, the upper target including at least one of a portion of the bond head assembly and the electronic component, the lower target including at least one of a portion of the support structure and the substrate.

17 Claims, 9 Drawing Sheets

(52) U.S. Cl.
CPC ................. *H10W 72/07141* (2026.01); *H10W 72/07178* (2026.01); *H10W 72/07183* (2026.01); *H10W 72/07223* (2026.01); *H10W 72/07231* (2026.01); *H10W 72/07232* (2026.01)

(56) References Cited

U.S. PATENT DOCUMENTS

| | | | | |
|---|---|---|---|---|
| 6,266,891 | B1 * | 7/2001 | Yamamoto | ........ H01L 21/67144 |
| | | | | 33/645 |
| 8,875,979 | B2 * | 11/2014 | Yung | ........................ H01L 24/75 |
| | | | | 228/103 |
| 9,099,350 | B2 | 8/2015 | Nakamura et al. | |
| 9,136,243 | B2 | 9/2015 | Schmidt-Lange et al. | |
| 10,692,833 | B2 * | 6/2020 | Kim | ........................ H01L 24/75 |
| 12,266,556 | B2 * | 4/2025 | Tarabulski | ........ H01L 21/67144 |
| 2001/0035450 | A1 | 11/2001 | Mannhart et al. | |
| 2003/0019909 | A1 | 1/2003 | Beatson et al. | |
| 2015/0155254 | A1 * | 6/2015 | Schmidt-Lange | ...... H01L 24/81 |
| | | | | 228/104 |

| | | | | |
|---|---|---|---|---|
| 2015/0380379 | A1 * | 12/2015 | Devasia | .................. H01L 24/75 |
| | | | | 228/8 |
| 2015/0380380 | A1 | 12/2015 | Schmidt-Lange et al. | |
| 2018/0114767 | A1 * | 4/2018 | Wasserman | ............. H01L 24/80 |

FOREIGN PATENT DOCUMENTS

| | | | | |
|---|---|---|---|---|
| JP | 2001024400 | A * | 1/2001 | ............. H01L 24/75 |
| JP | 3608497 | | 4/2002 | |
| JP | 5249073 | | 8/2010 | |
| JP | 2015005726 | A * | 1/2015 | |
| JP | 2016-092350 | | 5/2016 | |
| KR | 10-2014-0033368 | | 3/2014 | |

OTHER PUBLICATIONS

International Search Report for PCT Application No. PCT/US2022/031622 mailed on Sep. 29, 2022.
English Translation of Third Party Submission Dated Jun. 13, 2025 for corresponding Japanese Patent Application No. 2023-573325.
Japanese office action for Japanese patent application No. 2023-573325 dated Feb. 10, 2026.

* cited by examiner

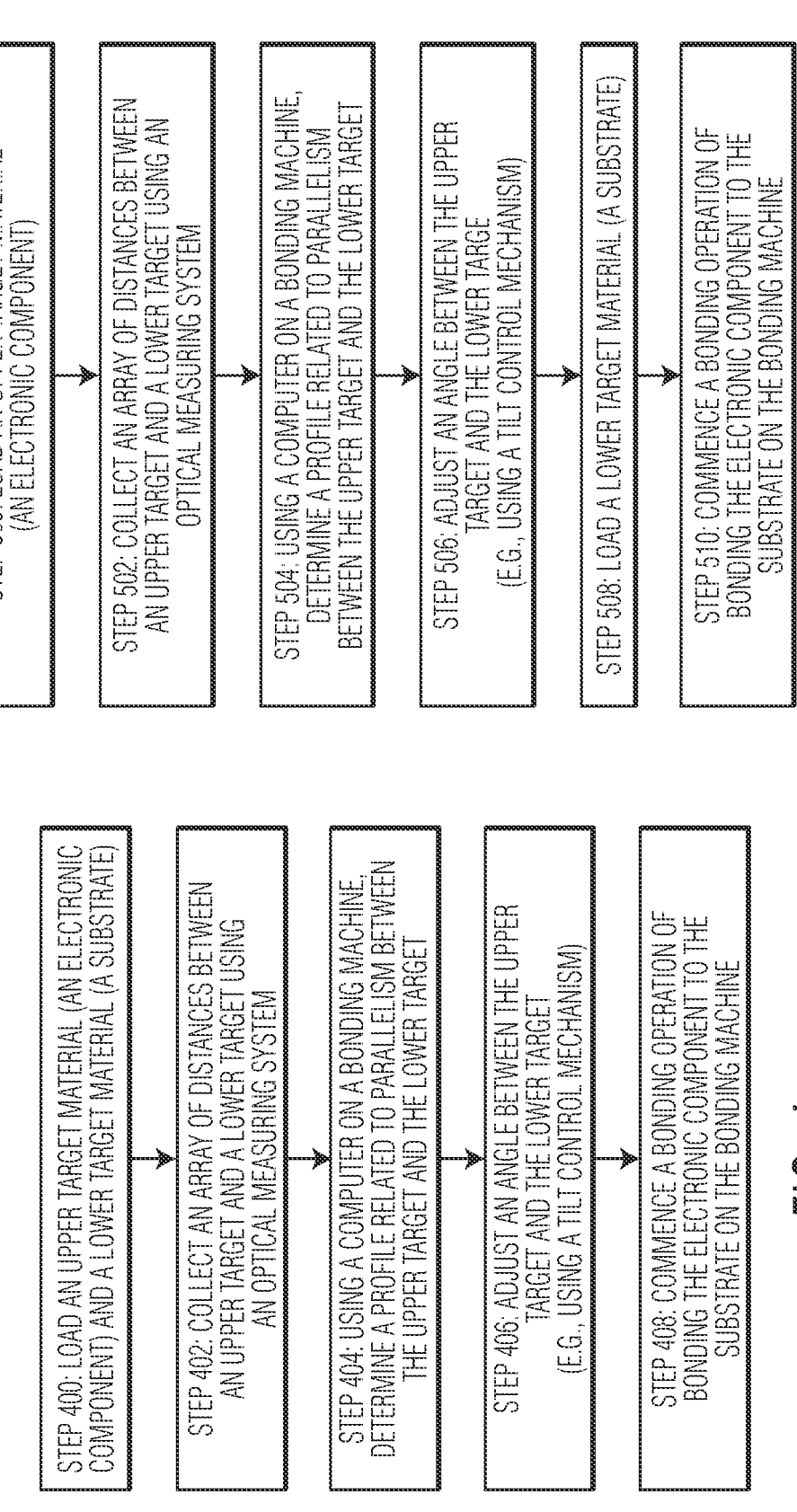

STEP 500: LOAD AN UPPER TARGET MATERIAL (AN ELECTRONIC COMPONENT)

STEP 502: COLLECT AN ARRAY OF DISTANCES BETWEEN AN UPPER TARGET AND A LOWER TARGET USING AN OPTICAL MEASURING SYSTEM

STEP 504: USING A COMPUTER ON A BONDING MACHINE, DETERMINE A PROFILE RELATED TO PARALLELISM BETWEEN THE UPPER TARGET AND THE LOWER TARGET

STEP 506: ADJUST AN ANGLE BETWEEN THE UPPER TARGET AND THE LOWER TARGE (E.G., USING A TILT CONTROL MECHANISM)

STEP 508: LOAD A LOWER TARGET MATERIAL (A SUBSTRATE)

STEP 510: COMMENCE A BONDING OPERATION OF BONDING THE ELECTRONIC COMPONENT TO THE SUBSTRATE ON THE BONDING MACHINE

FIG. 5

STEP 400: LOAD AN UPPER TARGET MATERIAL (AN ELECTRONIC COMPONENT) AND A LOWER TARGET MATERIAL (A SUBSTRATE)

STEP 402: COLLECT AN ARRAY OF DISTANCES BETWEEN AN UPPER TARGET AND A LOWER TARGET USING AN OPTICAL MEASURING SYSTEM

STEP 404: USING A COMPUTER ON A BONDING MACHINE, DETERMINE A PROFILE RELATED TO PARALLELISM BETWEEN THE UPPER TARGET AND THE LOWER TARGET

STEP 406: ADJUST AN ANGLE BETWEEN THE UPPER TARGET AND THE LOWER TARGET (E.G., USING A TILT CONTROL MECHANISM)

STEP 408: COMMENCE A BONDING OPERATION OF BONDING THE ELECTRONIC COMPONENT TO THE SUBSTRATE ON THE BONDING MACHINE

FIG. 4

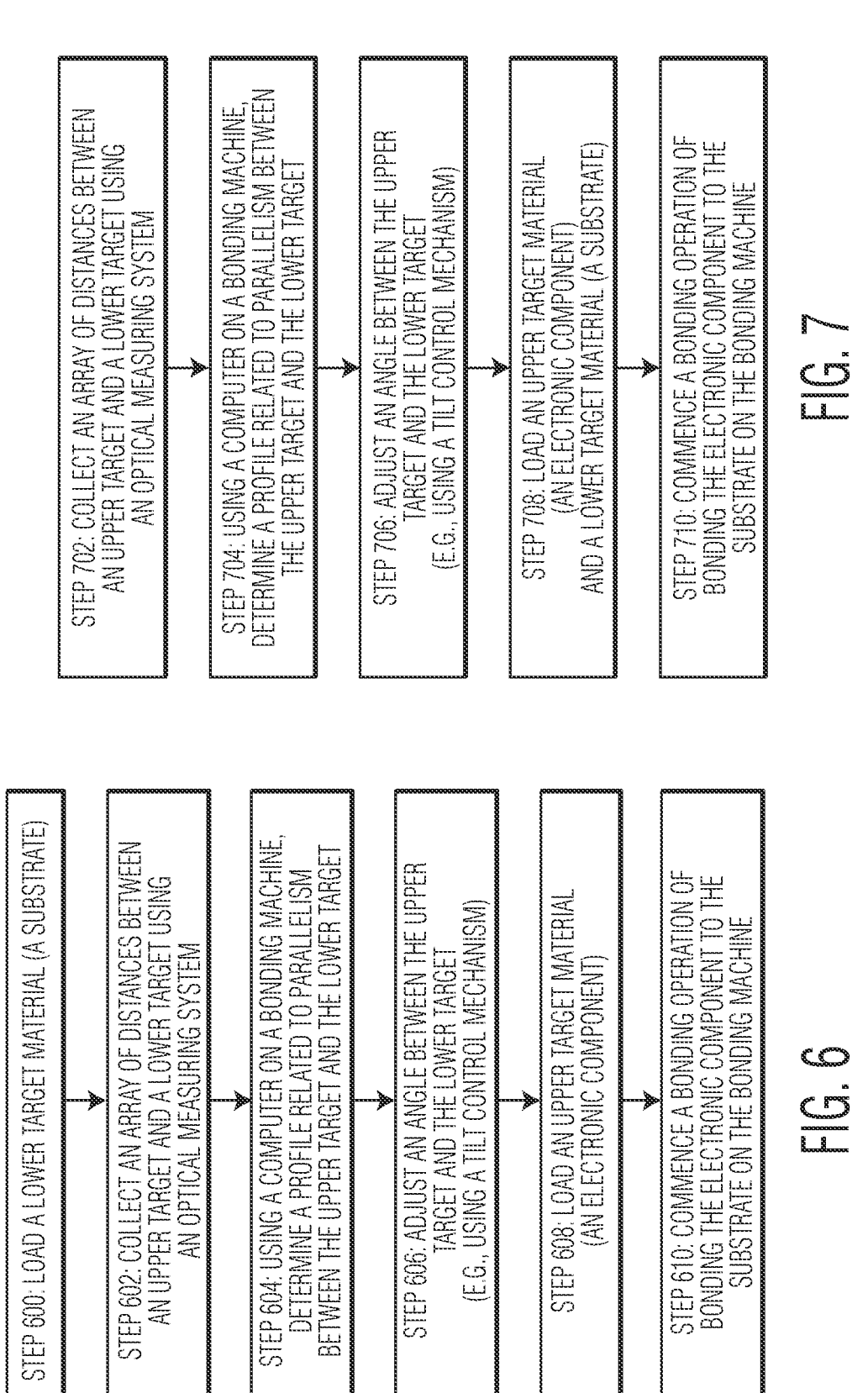

STEP 702: COLLECT AN ARRAY OF DISTANCES BETWEEN AN UPPER TARGET AND A LOWER TARGET USING AN OPTICAL MEASURING SYSTEM

STEP 704: USING A COMPUTER ON A BONDING MACHINE, DETERMINE A PROFILE RELATED TO PARALLELISM BETWEEN THE UPPER TARGET AND THE LOWER TARGET

STEP 706: ADJUST AN ANGLE BETWEEN THE UPPER TARGET AND THE LOWER TARGET (E.G., USING A TILT CONTROL MECHANISM)

STEP 708: LOAD AN UPPER TARGET MATERIAL (AN ELECTRONIC COMPONENT) AND A LOWER TARGET MATERIAL (A SUBSTRATE)

STEP 710: COMMENCE A BONDING OPERATION OF BONDING THE ELECTRONIC COMPONENT TO THE SUBSTRATE ON THE BONDING MACHINE

FIG. 7

STEP 600: LOAD A LOWER TARGET MATERIAL (A SUBSTRATE)

STEP 602: COLLECT AN ARRAY OF DISTANCES BETWEEN AN UPPER TARGET AND A LOWER TARGET USING AN OPTICAL MEASURING SYSTEM

STEP 604: USING A COMPUTER ON A BONDING MACHINE, DETERMINE A PROFILE RELATED TO PARALLELISM BETWEEN THE UPPER TARGET AND THE LOWER TARGET

STEP 606: ADJUST AN ANGLE BETWEEN THE UPPER TARGET AND THE LOWER TARGET (E.G., USING A TILT CONTROL MECHANISM)

STEP 608: LOAD AN UPPER TARGET MATERIAL (AN ELECTRONIC COMPONENT)

STEP 610: COMMENCE A BONDING OPERATION OF BONDING THE ELECTRONIC COMPONENT TO THE SUBSTRATE ON THE BONDING MACHINE

FIG. 6

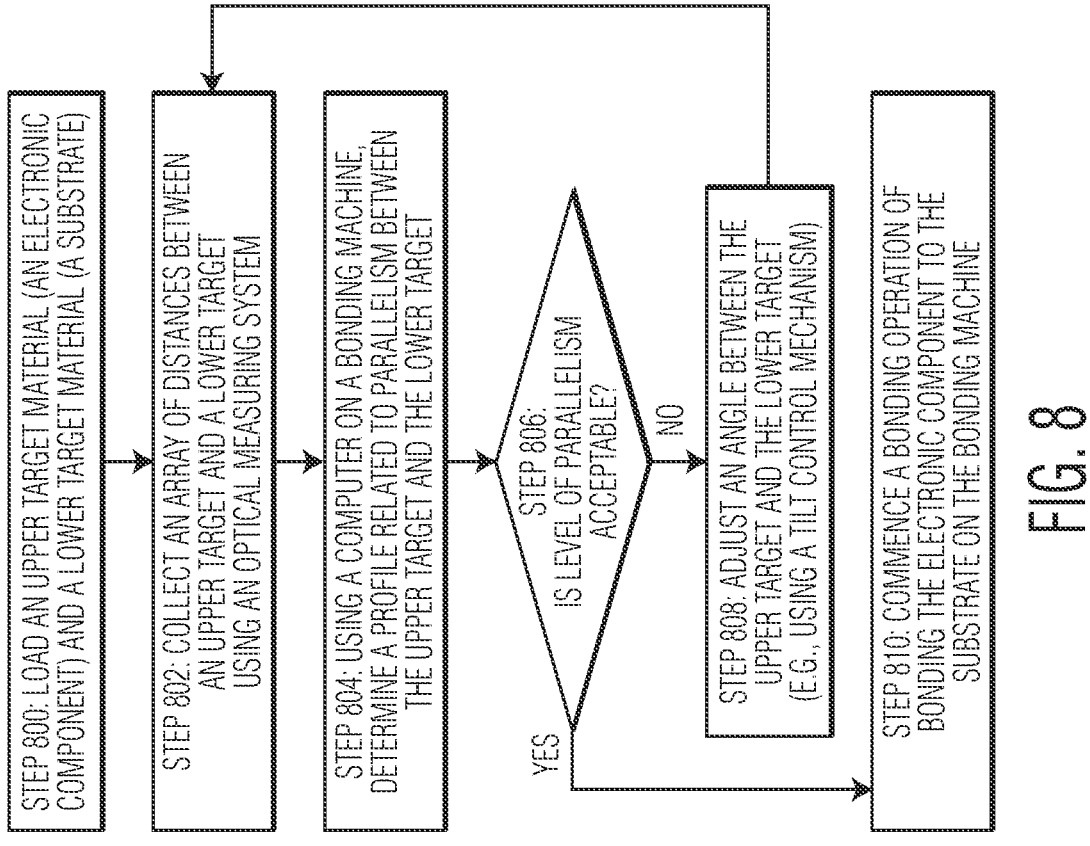

STEP 800: LOAD AN UPPER TARGET MATERIAL (AN ELECTRONIC COMPONENT) AND A LOWER TARGET MATERIAL (A SUBSTRATE)

STEP 802: COLLECT AN ARRAY OF DISTANCES BETWEEN AN UPPER TARGET AND A LOWER TARGET USING AN OPTICAL MEASURING SYSTEM

STEP 804: USING A COMPUTER ON A BONDING MACHINE, DETERMINE A PROFILE RELATED TO PARALLELISM BETWEEN THE UPPER TARGET AND THE LOWER TARGET

STEP 806: IS LEVEL OF PARALLELISM ACCEPTABLE?

YES

NO

STEP 808: ADJUST AN ANGLE BETWEEN THE UPPER TARGET AND THE LOWER TARGET (E.G., USING A TILT CONTROL MECHANISM)

STEP 810: COMMENCE A BONDING OPERATION OF BONDING THE ELECTRONIC COMPONENT TO THE SUBSTRATE ON THE BONDING MACHINE

FIG. 8

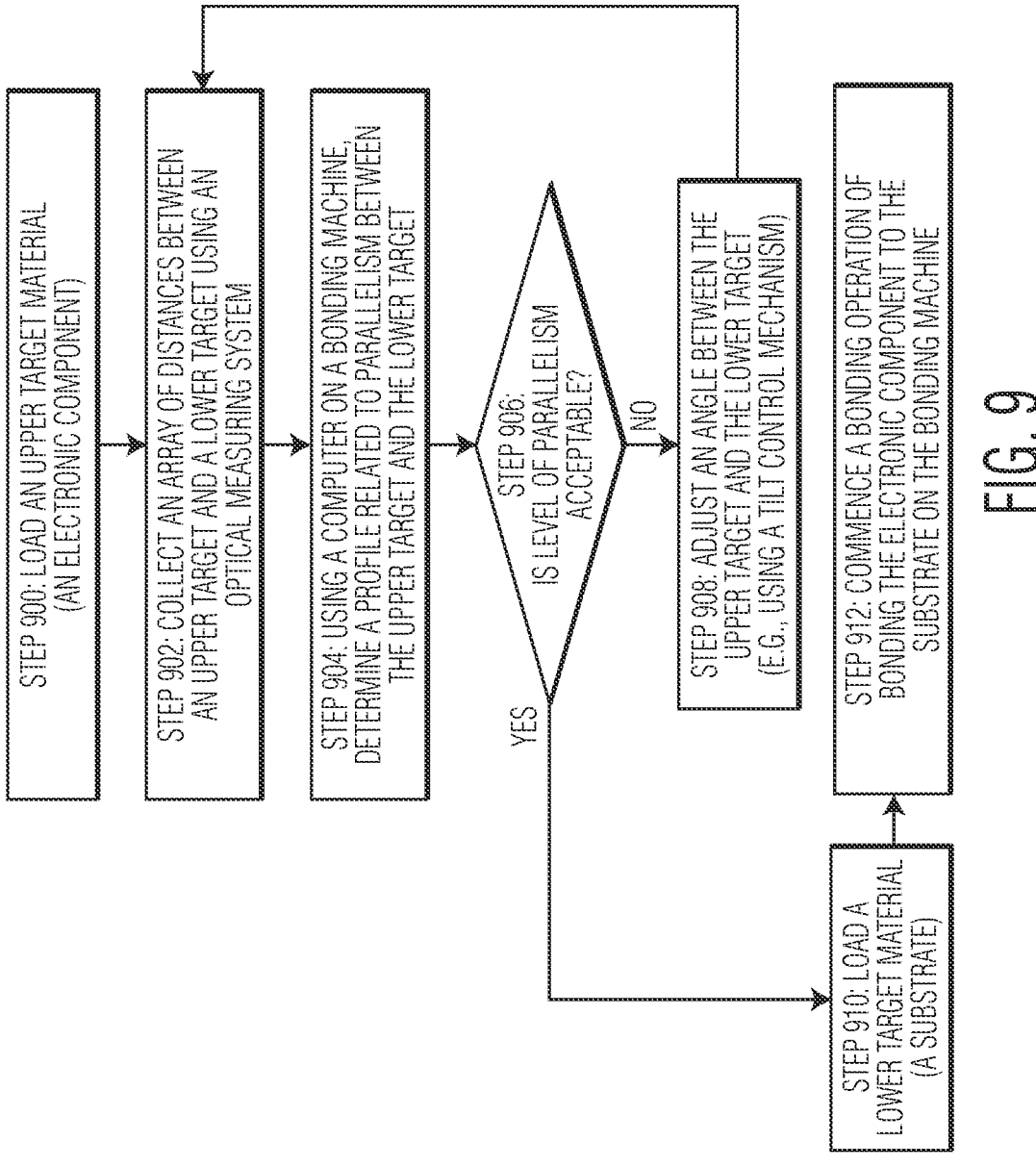

STEP 900: LOAD AN UPPER TARGET MATERIAL (AN ELECTRONIC COMPONENT)

STEP 902: COLLECT AN ARRAY OF DISTANCES BETWEEN AN UPPER TARGET AND A LOWER TARGET USING AN OPTICAL MEASURING SYSTEM

STEP 904: USING A COMPUTER ON A BONDING MACHINE, DETERMINE A PROFILE RELATED TO PARALLELISM BETWEEN THE UPPER TARGET AND THE LOWER TARGET

STEP 906: IS LEVEL OF PARALLELISM ACCEPTABLE?

NO

YES

STEP 908: ADJUST AN ANGLE BETWEEN THE UPPER TARGET AND THE LOWER TARGET (E.G., USING A TILT CONTROL MECHANISM)

STEP 910: LOAD A LOWER TARGET MATERIAL (A SUBSTRATE)

STEP 912: COMMENCE A BONDING OPERATION OF BONDING THE ELECTRONIC COMPONENT TO THE SUBSTRATE ON THE BONDING MACHINE

FIG. 9

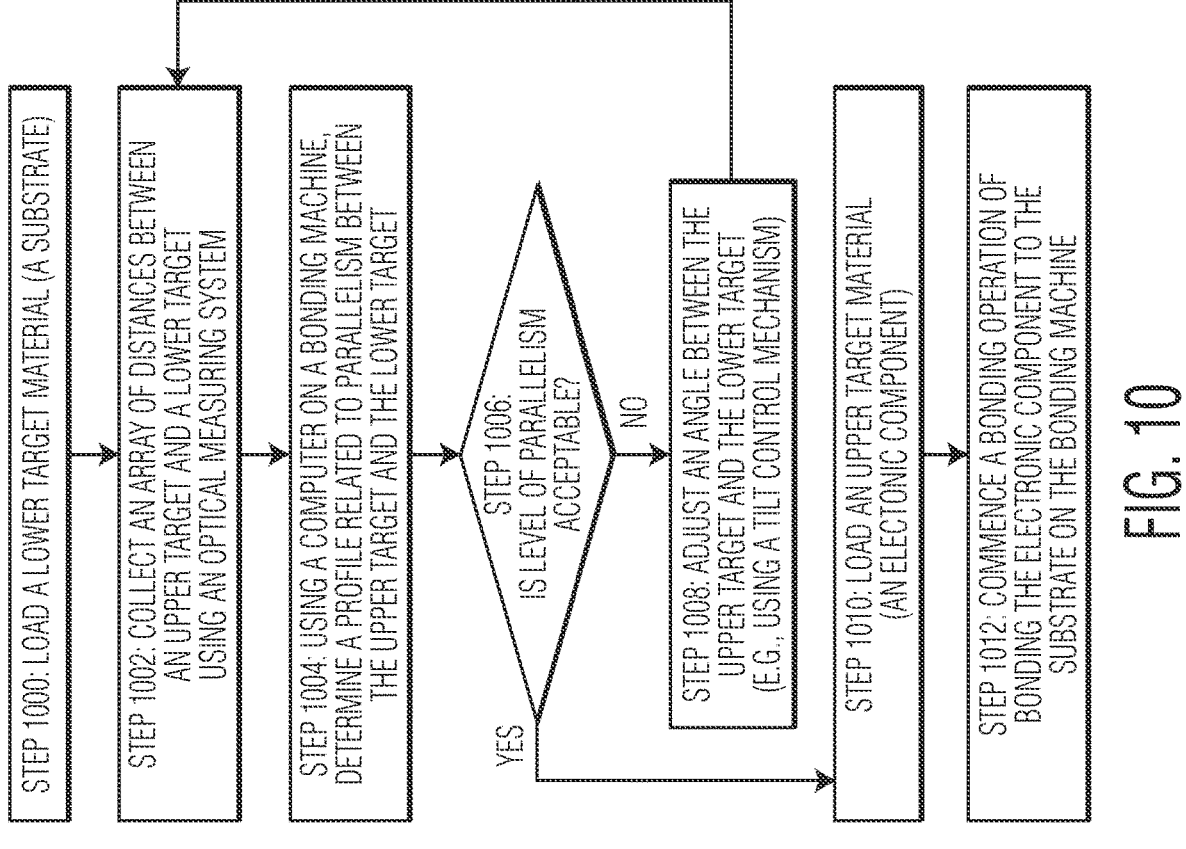

STEP 1000: LOAD A LOWER TARGET MATERIAL (A SUBSTRATE)

STEP 1002: COLLECT AN ARRAY OF DISTANCES BETWEEN AN UPPER TARGET AND A LOWER TARGET USING AN OPTICAL MEASURING SYSTEM

STEP 1004: USING A COMPUTER ON A BONDING MACHINE, DETERMINE A PROFILE RELATED TO PARALLELISM BETWEEN THE UPPER TARGET AND THE LOWER TARGET

STEP 1006: IS LEVEL OF PARALLELISM ACCEPTABLE?

YES

NO

STEP 1008: ADJUST AN ANGLE BETWEEN THE UPPER TARGET AND THE LOWER TARGET (E.G., USING A TILT CONTROL MECHANISM)

STEP 1010: LOAD AN UPPER TARGET MATERIAL (AN ELECTONIC COMPONENT)

STEP 1012: COMMENCE A BONDING OPERATION OF BONDING THE ELECTRONIC COMPONENT TO THE SUBSTRATE ON THE BONDING MACHINE

FIG. 10

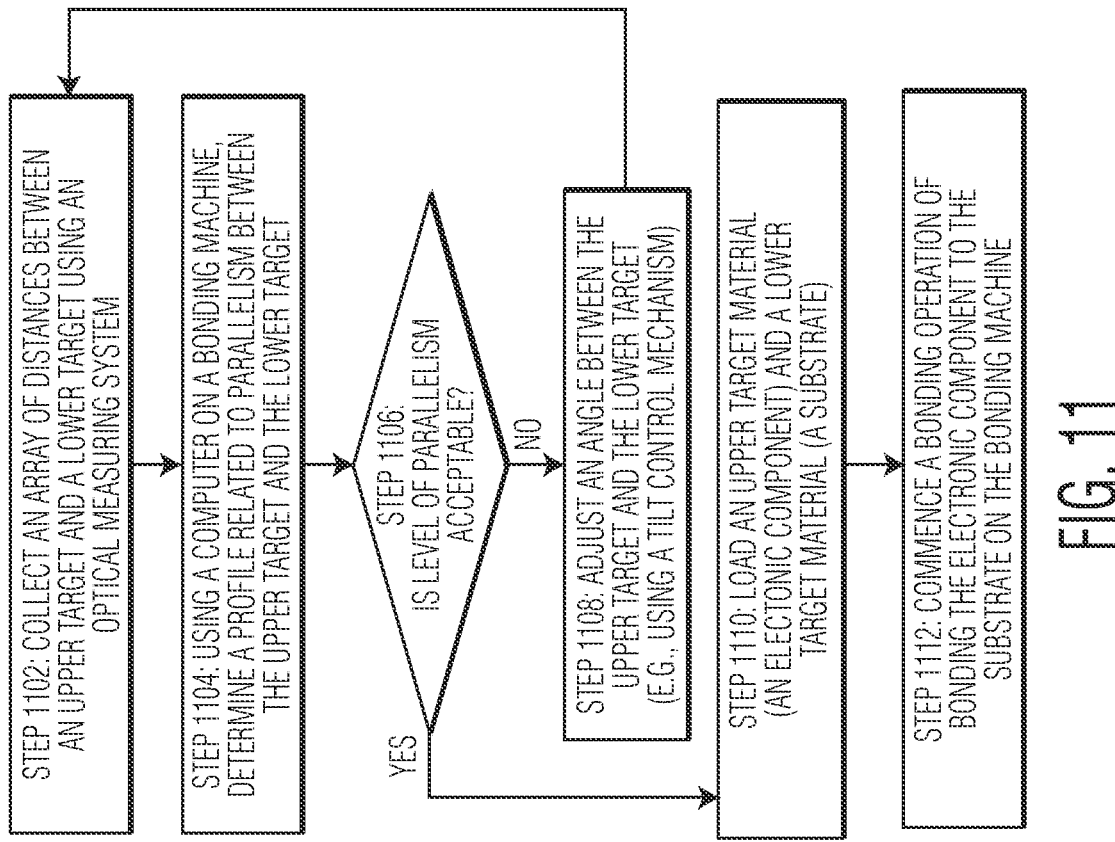

STEP 1102: COLLECT AN ARRAY OF DISTANCES BETWEEN AN UPPER TARGET AND A LOWER TARGET USING AN OPTICAL MEASURING SYSTEM

STEP 1104: USING A COMPUTER ON A BONDING MACHINE, DETERMINE A PROFILE RELATED TO PARALLELISM BETWEEN THE UPPER TARGET AND THE LOWER TARGET

STEP 1106: IS LEVEL OF PARALLELISM ACCEPTABLE?

NO

YES

STEP 1108: ADJUST AN ANGLE BETWEEN THE UPPER TARGET AND THE LOWER TARGET (E.G., USING A TILT CONTROL MECHANISM)

STEP 1110: LOAD AN UPPER TARGET MATERIAL (AN ELECTONIC COMPONENT) AND A LOWER TARGET MATERIAL (A SUBSTRATE)

STEP 1112: COMMENCE A BONDING OPERATION OF BONDING THE ELECTRONIC COMPONENT TO THE SUBSTRATE ON THE BONDING MACHINE

FIG. 11

ELECTRONIC COMPONENT BONDING MACHINES, AND METHODS OF MEASURING A DISTANCE ON SUCH MACHINES

CROSS-REFERENCE TO RELATED APPLICATION

This application claims the benefit of U.S. Provisional Application No. 63/195,705, filed Jun. 1, 2021, the content of which is incorporated herein by reference.

FIELD

The invention relates to electronic component bonding machines and, in particular, to measuring systems and related methods for such bonding machines.

BACKGROUND

In certain aspects of the semiconductor packaging industry, electronic components (e.g., semiconductor elements) are bonded to bonding locations. For example, in conventional die attach (also known as die bonding) applications, a semiconductor die is bonded to a bonding location (e.g., a leadframe, another die in stacked die applications, a spacer, etc.). In advanced packaging applications, semiconductor elements (e.g., bare semiconductor die, packaged semiconductor die, etc.) are bonded to bonding locations of a substrate (e.g., a leadframe, a PCB, a carrier, a semiconductor wafer, a BGA substrate, etc.), with conductive structures (e.g., conductive bumps, contact pads, solder bumps, conductive pillars, copper pillars, etc.) providing electrical interconnection between the semiconductor element and the bonding location.

In many applications (e.g., thermocompression bonding of semiconductor elements including solder bumps, etc.) it is particularly desirable to have a significant level of parallelism between the bonding tool and respective portions of a support structure of the bonding machine. For example, there may be many interconnections between (1) the electronic component being bonded by the bonding tool, and (2) the substrate supported by the support structure. These interconnections may include solder or the like, and as such, it is particularly desirable that there be substantial parallelism between the contact portion of the bonding tool and respective portions of the support structure.

U.S. Pat. No. 9,136,243 (titled "SYSTEMS AND METHODS FOR DETERMINING AND ADJUSTING A LEVEL OF PARALLELISM RELATED TO BONDING OF SEMICONDUCTOR ELEMENTS") is an example reference disclosing systems and methods for determining and adjusting such a level of parallelism. It would be desirable to provide improved systems for, and methods of, determining and adjusting the parallelism related to bonding of electronic components on a bonding machine.

SUMMARY

According to an exemplary embodiment of the invention, an electronic component bonding machine is provided. The electronic component bonding machine includes: a support structure for supporting a substrate (e.g., an organic substrate, an organic matrix substrate, a printed circuit board, a semiconductor wafer, etc.); a bond head assembly for holding an electronic component, and for bonding the electronic component to the substrate; and a measuring system for measuring a distance between (i) an upper target on the electronic component bonding machine and (ii) a lower target on the electronic component bonding machine, the upper target including at least one of a portion of the bond head assembly (e.g., a bonding tool, a nozzle, a heater, etc.) and the electronic component, the lower target including at least one of a portion of the support structure and the substrate. The measuring system includes an optical source for providing an optical signal directed toward at least one of the upper target and the lower target, an optical sensor for receiving a reflected optical signal from at least one of the lower target and the upper target, and a computer in communication with the optical sensor to determine the distance using information from the optical sensor.

According to an exemplary embodiment of the invention, an electronic component bonding machine is provided. The electronic component bonding machine includes: a support structure for supporting a substrate (e.g., an organic substrate, an organic matrix substrate, a printed circuit board, a semiconductor wafer, etc.); a bond head assembly for holding an electronic component, and for bonding the electronic component to the substrate; and a measuring system for measuring a profile related to parallelism between (i) an upper target on the electronic component bonding machine and (ii) a lower target on the electronic component bonding machine, the upper target including at least one of a portion of the bond head assembly (e.g., a bonding tool, a nozzle, a heater, etc.) and the electronic component, the lower target including at least one of a portion of the support structure and the substrate. The measuring system includes an optical source for providing an optical signal directed toward at least one of the upper target and the lower target, an optical sensor for providing a return optical signal to a computer, and a computer for determining the profile using the return optical signal (at a plurality of XY positions on the electronic component bonding machine).

According to another exemplary embodiment of the invention, a method of measuring a distance on an electronic component bonding machine is provided. The method includes directing an optical signal toward at least one of an upper target of the electronic component bonding machine and a lower target of the electronic component bonding machine. The upper target includes at least one of (i) a portion of a bond head assembly of the electronic component bonding machine and (ii) an electronic component carried by the bond head assembly. The lower target includes at least one of (i) a portion of a support structure of the electronic component bonding machine and (ii) a substrate supported by the support structure. The method also includes receiving, at an optical sensor, a reflected optical signal from at least one of the upper target and the lower target. The method also includes analyzing the reflected optical signal to determine a distance between the upper target and the lower target.

According to yet another exemplary embodiment of the invention, a method of bonding is provided. The method includes the steps of: (a) providing an electronic component; (b) supporting a substrate with a support structure; (c) carrying the electronic component with a bond head assembly of an electronic component bonding machine; (d) directing an optical signal toward at least one of an upper target of the electronic component bonding machine and a lower target of the electronic component bonding machine, the upper target including at least one of (i) a portion of the bond head assembly of the electronic component bonding machine and (ii) the electronic component carried by the bond head assembly, the lower target including at least one of (i) a portion of the support structure of the electronic component bonding machine and (ii) the substrate supported by the support structure; (e) receiving, at an optical sensor, a reflected optical signal from at least one of the upper target and the lower target; (f) analyzing the reflected optical signal to determine a distance between the upper target and the lower target; and (g) commencing a bonding operation of bonding the electronic component to the substrate.

According to yet another exemplary embodiment of the invention, a method of bonding is provided. The method includes the steps of: (a) loading an upper target material and a lower target material into an electronic component bonding machine; (b) collecting an array of distances between an upper target and a lower target using an optical measuring system; (c) using a computer on the electronic component bonding machine to determine a profile related to parallelism between the upper target and the lower target; (d) adjusting an angle between the upper target and the lower target; and (e) commencing a bonding operation of bonding the electronic component to the substrate.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 4-11 are flow diagrams illustrating various methods in accordance with various exemplary embodiments of the invention.

DETAILED DESCRIPTION

Figure 1:
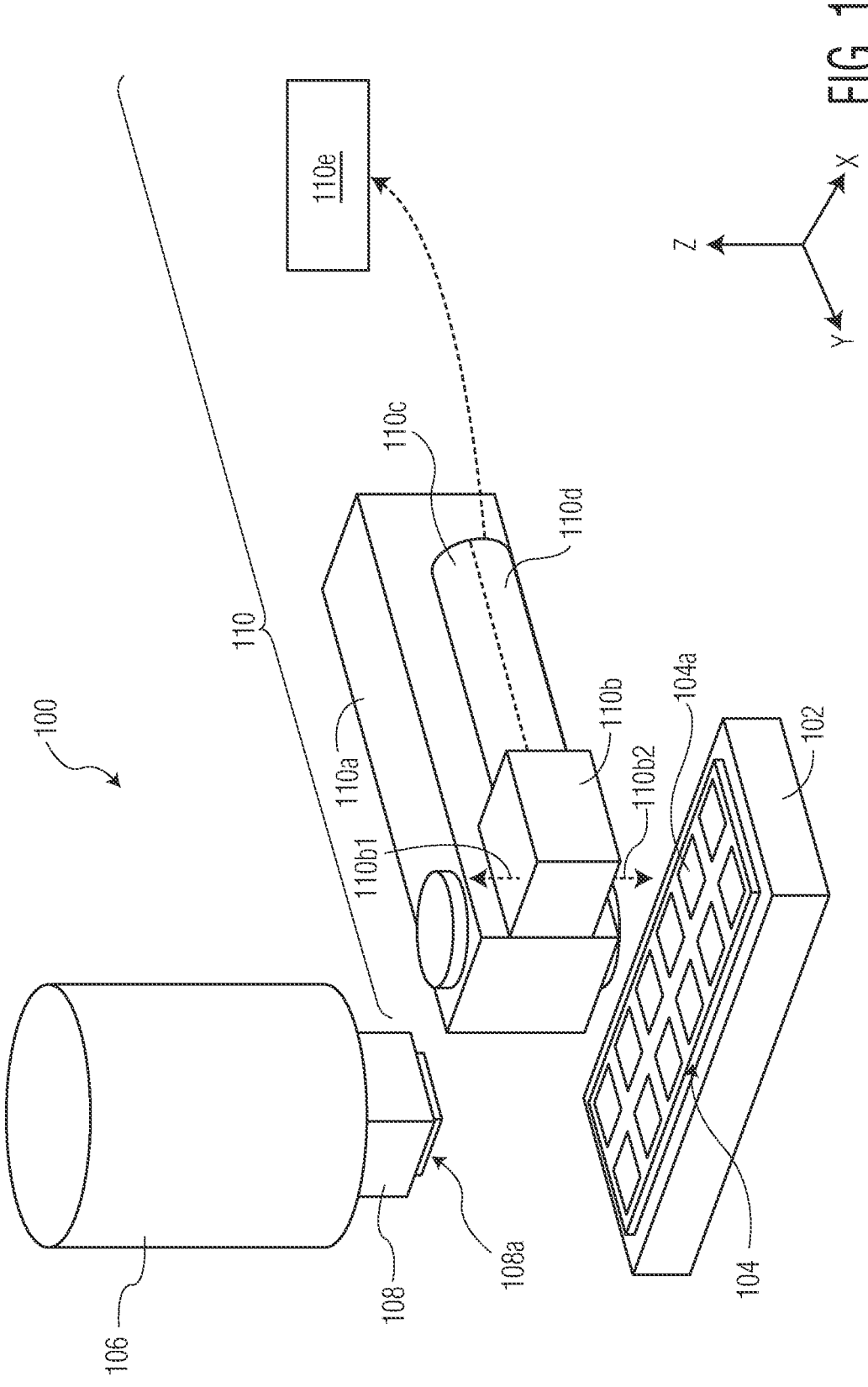
FIG. 1 is a simplified perspective view of an electronic component bonding machine in accordance with an exemplary embodiment of the invention.

As used herein, the term "electronic component" is intended to refer to any component configured to be "placed on" or "bonded to" a substrate of a semiconductor package. Exemplary electronic components include semiconductor elements (e.g., semiconductor die, semiconductor chips, etc.), SMT (surface mount technology) components, passive components (e.g., capacitors), transistors, diodes, etc.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semicondcutor wafer, a BGA substrate, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the term "substrate" is intended to refer to any structure to which an electronic component (e.g., a semiconductor element) may be bonded (e.g., thermocompressively bonded, ultrasonically bonded, thermosonically bonded, die bonded, etc.). Exemplary substrates include, for example, a leadframe, a PCB, a carrier, a semiconductor wafer, a BGA substrate, a semiconductor element, etc.

As used herein, the term "profile" related to parallelism between an upper target and a lower target—refers to information which may be used to establish such parallelism. For example, the profile may be a plurality of distances between the upper target and the lower target, and their spatial relationship (e.g., in an XY plane). In another example, the profile may be a "tilt" map in an XY plane, with a curve fit to the plurality of distance measurements between an upper target and a lower target.

In accordance with certain exemplary embodiments of the present invention, a bonding machine (e.g., a thermocompression bonding machine, a die attach machine, a flip chip bonding machine, etc.) includes a bond head assembly carrying a bonding tool. The bonding tool places and bonds an electronic component (e.g., a semiconductor element, a semiconductor die, an interposer, etc.) to a substrate. Such a bonding process may include melting and re-solidifying solder bumps on the electronic component being placed to create solder bonds. Controlling the height of the finished solder bonds is a desirable process control objective. In this embodiment, because all of the solder bumps on the electronic component are bonded at one time, the variation in the resulting solder bond height across the electronic component depends directly on the parallelism of the electronic component being bonded and the target substrate. In terms of the bonding machine, it is desirable to control the paralellism between the bonding tool (e.g., a contact portion/contact surface of the bonding tool) and the support structure (which may also be referred to as the bonding stage) of the bonding machine. The desired window for parallelism (or coplanarity) across the substrate may be very narrow (e.g., a variation of 0.1-2 microns across the substrate). Therefore, very accurate alignment of the bonding tool and the support structure is desired.

According to certain exemplary embodiments, the invention relates to a method of determining (e.g., measuring) a level of parallelism between the bonding tool and the support structure, for example, in order to verify that the calibration has been successful, so that bonding can proceed with confidence in achieving the desired bond height control. Further, the determination of the level of parallelism may be used to generate a desired correction motion/adjustment for the bonding tool (e.g., using an active/passive tilt control mechanism in the bonding tool) and/or the support structure.

Aspects of the invention relate to non-contact systems and methods for determining a level of parallelism related to bonding of semiconductor elements.

Aspects of the invention relate to a measuring system for an electronic component bonding machine. For example, such a bonding machine may be a die attach machine for performing a local reflow solder die attach process. In such a process, a bonding tool places and bonds a die or interposer to a substrate, chip, or wafer by melting and re-solidifying solder bumps on the die being placed. The parallelism of the bonding tool to the substrate (e.g., wafer) is desirably well controlled (e.g., to better than 1 μm over the size of the device to the bonded). The invention relates to the use of an optical sensor (e.g., a non-contact optical sensor, a confocal chromatic sensor, an interferometric sensor, etc.) in a measuring system.

According to certain embodiments of the invention, optical elements may be used to split an optical signal/beam path into multiple paths (e.g., where such paths may be nominally 180 degrees apart). One path is directed upward towards a portion of a bond head assembly (e.g., a bonding tool of the bond head assembly) and/or towards an electronic component carried by the bond head assembly. The other path is directed downward towards a support structure for supporting a substrate (e.g., a bonding chuck) and/or towards a target substrate (e.g., a wafer or other substrate configured to receive the electronic component carried by the bond head assembly). A single optical sensor receives a combined return signal and, in connection with a computer, a distance between the upper and lower surfaces may be calculated. By moving elements of a measuring system within the XY plane of the electronic component bonding machine, a plurality of distances between the upper surface and the lower surface can be collected. Further, a plane can be fit to the distances to determine an angle between the upper and lower surfaces (e.g., an example profile related to parallelism).

The optical sensor (of the measuring system) may also be used in a single side mode where various other non-parallelism measurements may be collected included by not limited to: (1) flatness or shape of the upper or lower surface with respect to a plane of a system moving the optical sensor; and (2) position of a lower or upper measurement point with respect to time. An example of this mode is probing a surface of a portion of the bond head assembly (e.g., a heater, or a heated bonding tool, of the bond head assembly) for deformation during a simulated (no die present) heating and cooling cycle where several points in the XY plane are measured during a simulated bonding cycle. An algorithm may be used to combine the separate point data into a time dependent surface plot of the system being measured. This may be valuable to the end user of equipment using an embodiment of the invention as flatness of the heater surface during a bond process is important for high quality bonds to be formed without imparting unacceptable variation in solder line thickness of an end product.

Aspects of the invention have benefits over prior practices. For example, a non-contact optical sensor may have a much higher sampling rate compared to a contact probe. This allows for one or both of the following: (1) more measurement points can be collected in a fixed time period allowing for additional filtering of data to reduce measurement noise; and (2) the measurement can be completed faster, increasing the throughput of equipment using an embodiment of the invention. By the nature of being non-contact, no force is applied to either the lower or upper surface (e.g., measurement surface). For targets that are sensitive to force or could otherwise be damaged by a contacting probe, an embodiment of the invention has no risk of damaging either the lower or upper surface. Either (or both) of the lower and upper targets may be heated during measurement. Since there is no contact required in an embodiment of the invention, there is no conductive path for heat transfer and measurement is thus more immune to thermal effects that could otherwise create errors, as in a contact-based measurement.

According to certain exemplary aspects of the invention, optical elements (e.g., a beam splitter, a prism, a switchable mirror, a knife mirror that divides the optical signal, etc.) are used in connection with a single optical sensor to "bounce" and measure the distance between two surfaces.

According to certain exemplary aspects of the invention, distance measurements taken on the electronic component bonding machine are used to determine parallelism (e.g. the tilt of an electronic component carried by a bonding tool, the tilt of a bonded electronic component, the tilt of a substrate, etc.).

According to certain exemplary aspects of the invention, a single measurement beam (i.e., the source optical signal is not split) of a measurement system may be used to measure: a time variant shape of a heater of the electronic component bonding machine; the flatness of either an upper or lower surface (e.g., a portion of the bond head assembly such as a bonding tool; a heater; an electronic component; a portion of the support structure such as a bond chuck; and/or a substrate).

Referring now to the drawings, FIG. 1 is a perspective view of an electronic component bonding machine 100. Electronic component bonding machine 100 includes a support structure 102 (e.g., carrying a substrate 104 (including lower target 104a)), a bond head assembly 106 (including a bonding tool 108, which may be a heated bonding tool, a nozzle, etc.) (where bonding tool 108 is illustrated carrying an electronic component 108a), and a measuring system 110. Measuring system 110 includes an arm assembly 110a (e.g., for carrying certain other elements of measuring system 110, as shown), an optical assembly 110b, an optical source 110c, an optical sensor 110d, and a computer 110e (e.g., a computer for analyzing a frequency spectrum of a reflected optical signal to determine a distance between an upper target and a lower target).

Figure 3:
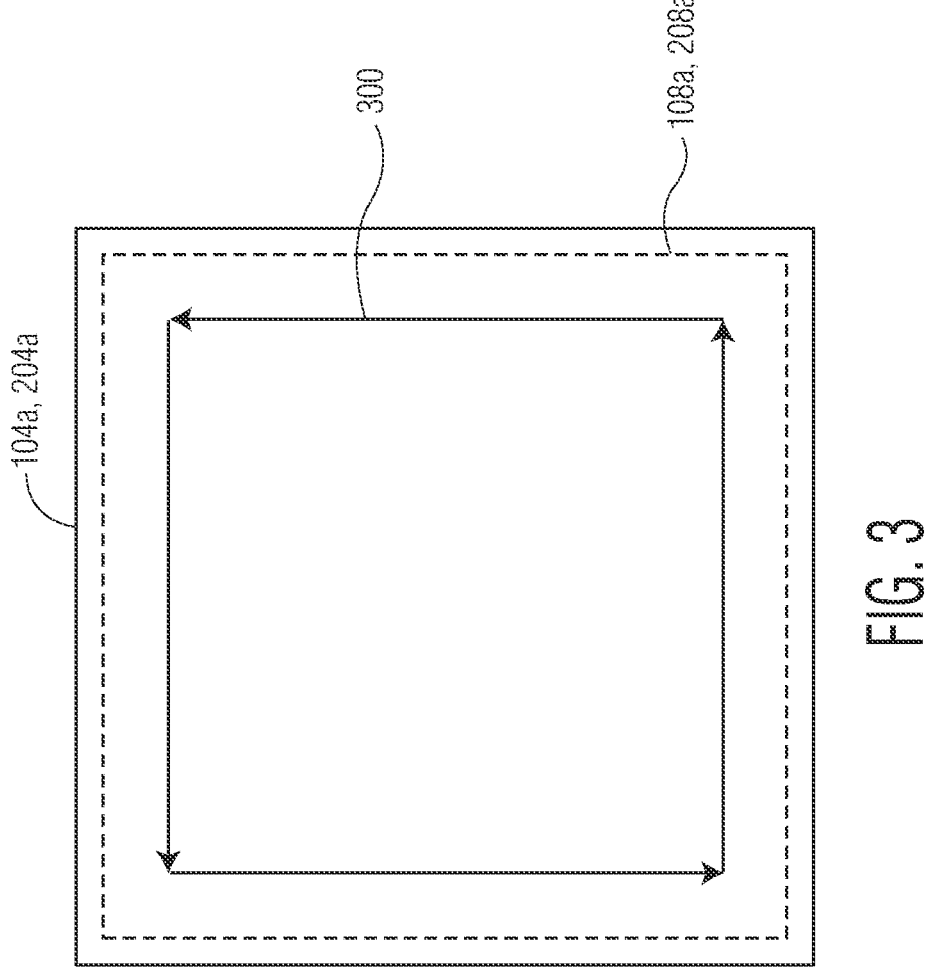
FIG. 3 is a scan pattern for moving a portion of a measuring system within an XY plane on an electronic component bonding machine in accordance with an exemplary embodiment of the invention.

Arm assembly 110a (which may carry optical assembly 110b, an optical source 110c, an optical sensor 110d) may be moved together with, or independently from, bond head assembly 106. As shown in FIG. 3, bond head assembly 106 (and arm assembly 110a) may be moved within an XY plane of electronic component bonding machine 100 to measure a plurality of distances, as described below. An optical signal from optical source 110c enters optical assembly 110b. This optical signal may be divided into upper optical signal portion 110b1 (directed toward an upper target such as a portion of bond head assembly 106 and/or electronic component 108a) and lower optical signal portion 110b2 (directed toward a lower target such as a portion of support structure 102 or substrate 104). These signal portions reflect off of their respect targets, and recombine at optical assembly 110b, thereby providing a single return optical signal. This return optical signal is received by optical sensor 110d which, in connection with computer 100e, determines a distance between the upper target and the lower target.

Figure 2:
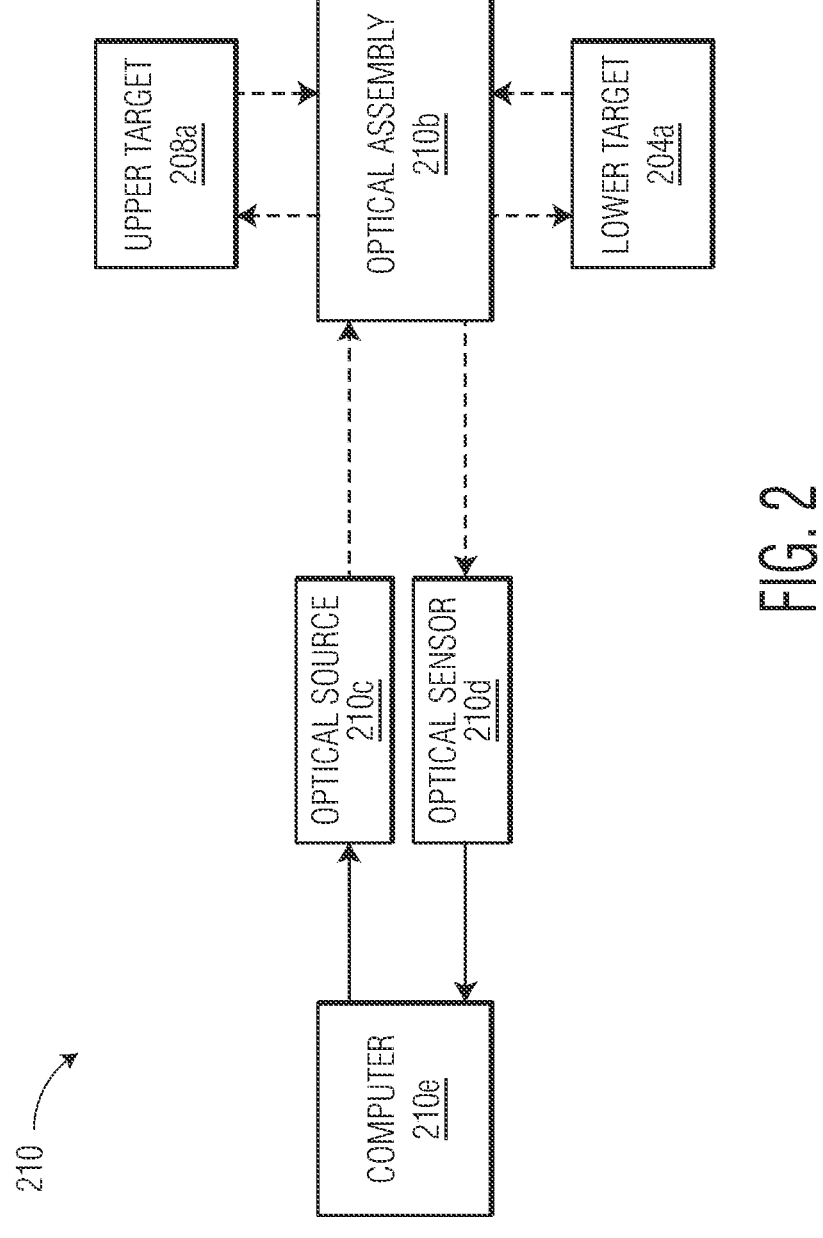
FIG. 2 is a block diagram of a measuring system of an electronic component bonding machine in accordance with an exemplary embodiment of the invention.

FIG. 2 is a block diagram of a measuring system 210 (i.e., measuring system 110 of FIG. 1). Measuring system 210 includes an optical assembly 210b, an optical source 210c, optical sensor 210d, and a computer 210e. As illustrated, optical assembly 210b is configured to transmit optical signals to, and/or receive reflected optical signals from, an upper target 208a and/or a lower target 204a. Optical assembly 210b is configured to receive an optical signal from optical source 210c; optical assembly 210b is also configured to provide a return optical signal to optical sensor 210d. Computer 210e (e.g., a computer for analyzing a frequency spectrum of a reflected optical signal to determine a distance between an upper target and a lower target) is configured to communicate with optical source 210c and/or optical sensor 210d.

FIG. 3 shows an example scan pattern 300 for moving a portion of measuring system within an XY plane on an electronic component bonding machine in accordance with an exemplary embodiment of the invention. For purposes of illustration, upper target 108*a*/208*a* is overlayed on lower target 104*a*/204*a*. Of course, other scan patterns are contemplated within the scope of the invention.

FIGS. 4-11 are flow diagrams illustrating exemplary methods in accordance with the invention such as: methods of measuring a distance; methods of determining a profile related to parallelism; methods of bonding an electronic component on a bonding machine (e.g., see electronic component bonding machine 100 in FIG. 1). As is understood by those skilled in the art, certain steps included in the flow diagrams may be omitted; certain additional steps may be added; and the order of the steps may be altered from the order illustrated—all within the scope of the invention.

Further, it should be appreciated by those skilled in the art that the various steps included in these flow diagrams may occur at different times. For example, each of FIGS. 4-11 includes a step related to determining a profile related to parallelism between an upper target and a lower target (e.g., see Step 404, 504, 604, 704, 804, 904, 1004, and 1104 in each of respective FIGS. 4-11). After this step, each of FIGS. 4-11 includes a step of using a tilt control mechanism to adjust an angle between the upper target and the lower target (e.g., see Step 406 in FIG. 4). It shall be appreciated that the profile may be determined in one step (e.g., Step 404 in FIG. 4), and then the profile may be saved (or otherwise stored in memory), for use at a later time to adjust the angle (e.g., see Step 406 in FIG. 4).

Each of FIGS. 4-11 is a different exemplary configuration. In FIG. 4, the upper target will include the electronic component, and the lower target will include the substrate. FIG. 4 is a flow diagram illustrating a method of measuring a plurality of distances to generate a profile related to parallelism between an electronic component and a substrate on a bonding machine (e.g., bonding machine 100 in FIG. 1), and then bonding the electronic component to the substrate. At Step 400, an upper target material (e.g., an electronic component) and a lower target material (e.g., a substrate) are loaded into an electronic component bonding machine. At Step 402 an array of distances between an upper target (e.g., the electronic component) and a lower target (e.g., the substrate) using an optical measuring system (e.g., see measuring system 110 in FIG. 1, and measuring system 210 in FIG. 2) is collected. At Step 404, using a computer on a bonding machine (or connected to the bonding machine), a profile related to parallelism between the upper target and the lower target is determined using the plurality of distances. At Step 406, an angle between the upper target and the lower target is adjusted (e.g., using a tilt control mechanism) using the profile. At Step 408, a bonding operation of bonding the electronic component to the substrate on the bonding machine is commenced.

Referring now to FIG. 5, the upper target will include the electronic component, but the lower target will not include the substrate (e.g., the lower target will include a portion of the support structure). FIG. 5 is a flow diagram illustrating a method of measuring a plurality of distances to generate a profile related to parallelism between an electronic component and a support structure on a bonding machine (e.g., bonding machine 100 in FIG. 1), and then bonding the electronic component to a substrate. At Step 500, an upper target material (an electronic component) is loaded onto an electronic component bonding machine. At Step 502, an array of distances between an upper target (e.g., the electronic component) and a lower target (e.g., the support structure) is collected using an optical measuring system (e.g., see measuring system 110 in FIG. 1, and measuring system 210 in FIG. 2). At Step 504, using a computer on a bonding machine (or connected to the bonding machine), a profile related to parallelism between the upper target and the lower target is determined using the plurality of distances. At Step 506, an angle between the upper target and the lower target is adjusted (e.g., using a tilt control mechanism) using the profile. At Step 508 a lower target material (e.g., a substrate) is loaded onto the bonding machine. At Step 510, a bonding operation of bonding the electronic component to the substrate is commenced on the bonding machine.

Referring now to FIG. 6, the upper target will not include the electronic component (e.g., the upper target will include a portion of a bond head assembly), and the lower target will include the substrate. FIG. 6 is a flow diagram illustrating a method of measuring a plurality of distances to generate a profile related to parallelism between a bond head assembly and a substrate on a bonding machine (e.g., bonding machine 100 in FIG. 1), and then bonding an electronic component to a substrate. At Step 600, a lower target material (a substrate) is loaded onto a bonding machine. At Step 602, an array of distances between an upper target (e.g., a portion of a bond head assembly) and a lower target (e.g., a substrate) is collected using an optical measuring system (e.g., see measuring system 110 in FIG. 1, and measuring system 210 in FIG. 2). At Step 604, using a computer on a bonding machine (or connected to the bonding machine), a profile related to parallelism between the upper target and the lower target is determined using the plurality of distances. At Step 606, an angle between the upper target and the lower target is adjusted (e.g., using a tilt control mechanism) using the profile. At Step 608, an upper target material (an electronic component) is loaded on the bonding machine. At Step 610, a bonding operation of bonding the electronic component to the substrate on the bonding machine is commenced.

Referring now to FIG. 7, the upper target will not include the electronic component (e.g., the upper target will include a portion of a bond head assembly), and the lower target will not include the substrate (e.g., the lower target will include a portion of the support structure). FIG. 7 is a flow diagram illustrating a method of measuring a plurality of distances to generate a profile related to parallelism between the bond head assembly and the support structure on a bonding machine (e.g., bonding machine 100 in FIG. 1), and then bonding an electronic component to a substrate. At Step 702, an array of distances between an upper target (e.g., a portion of the bond head assembly) and a lower target (e.g., a portion of the support structure) is collected using an optical measuring system (e.g., see measuring system 110 in FIG. 1, and measuring system 210 in FIG. 2). At Step 704, using a computer on a bonding machine (or connected to the bonding machine), a profile related to parallelism between the upper target and the lower target is determined using the plurality of distances. At Step 706, an angle between the upper target and the lower target is adjusted (e.g., using a tilt control mechanism) using the profile. At Step 708, an upper target material (an electronic component) and a lower target material (a substrate) are loaded on the bonding machine. At Step 710, a bonding operation of bonding the electronic component to the substrate on the bonding machine is commenced.

Each of the embodiments of the invention (including the methods illustrated in FIGS. 4-7) may include one or more "feedback" steps. For example, each of FIGS. 4-7 includes determining a profile related to parallelism between an upper target and a lower target (e.g., see Step 404, 504, 604, and 704 in each of respective FIGS. 4-7). The methods may include feedback as to whether the level of parallelism is acceptable based on predetermined criteria. Each of FIGS. 8-11 is substantially similar to a corresponding one of FIGS. 4-7; however, each of FIGS. 8-11 includes a step of determining if the level of parallelism is acceptable, and a corresponding process flow if the level of parallelism is (or is not) acceptable.

FIG. 8 is a flow diagram similar to FIG. 4. At Step 800, an upper target material (an electronic component) and a lower target material (a substrate) are loaded on a bonding machine (e.g., bonding machine 100 in FIG. 1). At Step 802, an array of distances between an upper target and a lower target is collected using an optical measuring system. At Step 804, using a computer on a bonding machine (or connected to the bonding machine), a profile related to parallelism between the upper target and the lower target is determined using the plurality of distances. At Step 806, a determination is made as to whether the level of parallelism is acceptable. If not acceptable ("No"), an angle between the upper target and the lower target is adjusted (e.g., using a tilt control mechanism) at Step 808 (and the process continues in repeated Steps 802-806). If acceptable ("Yes"), a bonding operation of bonding the electronic component to the substrate on the bonding machine is commenced at Step 810.

FIG. 9 is a flow diagram similar to FIG. 5. At Step 900, an upper target material (an electronic component) is loaded onto a bonding machine (e.g., bonding machine 100 in FIG. 1). At Step 902, an array of distances between an upper target and a lower target is measured using an optical measuring system. At Step 904, using a computer on a bonding machine (or connected to the bonding machine), a profile related to parallelism between the upper target and the lower target is determined using the plurality of distances. At Step 906, a determination is made as to whether the level of parallelism is acceptable. If not acceptable ("No"), an angle between the upper target and the lower target is adjusted (e.g., using a tilt control mechanism) at Step 908 (and the process continues in repeated Steps 902-906). If acceptable ("Yes"), a lower target material (a substrate) is loaded onto the bonding machine at Step 910. At Step 912, a bonding operation of bonding the electronic component to the substrate on the bonding machine is commenced.

FIG. 10 is a flow diagram similar to FIG. 6. At Step 1000, a lower target material (a substrate) is loaded onto a bonding machine (e.g., bonding machine 100 in FIG. 1). At Step 1002, an array of distances between an upper target and a lower target is collected using an optical measuring system. At Step 1004, using a computer on a bonding machine (or connected to the bonding machine), a profile related to parallelism between the upper target and the lower target is determined using the plurality of distances. At Step 1006, a determination is made as to whether the level of parallelism is acceptable. If not acceptable ("No"), an angle between the upper target and the lower target is adjusted (e.g., using a tilt control mechanism) at Step 1008 (and the process continues in repeated Steps 1002-1006). If acceptable ("Yes"), an upper target material (an electronic component) is loaded onto the bonding machine at Step 1010. At Step 1012, a bonding operation of bonding the electronic component to the substrate on the bonding machine is commenced.

FIG. 11 is a flow diagram similar to FIG. 7. At Step 1102, an array of distances between an upper target and a lower target is collected using an optical measuring system on a bonding machine (e.g., bonding machine 100 in FIG. 1). At Step 1104, using a computer on a bonding machine (or connected to the bonding machine), a profile related to parallelism between the upper target and the lower target is determined using the plurality of distances. At Step 1106, a determination is made as to whether the level of parallelism is acceptable. If not acceptable ("No"), an angle between the upper target and the lower target is adjusted (e.g., using a tilt control mechanism) at Step 1108 (and the process continues in repeated Steps 1102-1106). If acceptable ("Yes"), an upper target material (an electronic component) and a lower target material (a substrate) are loaded onto the bonding machine at Step 1110. At Step 1112, a bonding operation of bonding the electronic component to the substrate on the bonding machine is commenced.

Although the invention is illustrated and described herein with reference to specific embodiments, the invention is not intended to be limited to the details shown. Rather, various modifications may be made in the details within the scope and range of equivalents of the claims and without departing from the invention

What is claimed:

1. An electronic component bonding machine comprising:
a support structure for supporting a substrate;
a bond head assembly for holding an electronic component, and for bonding the electronic component to the substrate; and
a measuring system for measuring a distance between (i) an upper target on the electronic component bonding machine and (ii) a lower target on the electronic component bonding machine, the upper target including a portion of the bond head assembly or the electronic component, the lower target including a portion of the support structure or the substrate,
the measuring system including (a) an optical source for providing an optical signal, (b) an optical assembly connected to the optical source, the optical assembly including an optical element for splitting the optical signal into an upper optical signal directed toward the upper target and a lower optical signal directed toward the lower target, the optical assembly providing a recombined optical signal, the recombined optical signal including the lower optical signal reflected from the lower target and the upper optical signal reflected from the upper target, (c) an optical sensor connected to the optical assembly for receiving the recombined optical signal from the optical assembly, and (d) a computer in communication with the optical sensor to determine the distance using information from the optical sensor,
wherein a portion of the measuring system is configured to be moved to a plurality of positions within an XY plane of the electronic component bonding machine for measuring the distance between the upper target and the lower target at each of the plurality of positions, wherein the distance measured at each of the plurality of positions are collectively used to determine a profile related to parallelism between the upper target and the lower target.

2. The electronic component bonding machine of claim 1 wherein the electronic component is a semiconductor chip.

3. The electronic component bonding machine of claim 1 wherein the substrate is a semiconductor wafer.

4. The electronic component bonding machine of claim 1 wherein the upper target is the portion of the bond head assembly, and the lower target is the portion of the support structure.

5. The electronic component bonding machine of claim 1 wherein the upper target is the portion of the bond head assembly, and the lower target is the substrate.

6. The electronic component bonding machine of claim 1 wherein the upper target is the electronic component, and the lower target is the portion of the support structure.

7. The electronic component bonding machine of claim 1 wherein the upper target is the electronic component, and the lower target is the substrate.

8. The electronic component bonding machine of claim 1 wherein the portion of the bond head assembly is a bonding tool for holding the electronic component, and for bonding the electronic component to the substrate.

9. The electronic component bonding machine of claim 1 wherein the portion of the bond head assembly is a heated bonding tool for holding the electronic component, and for bonding the electronic component to the substrate.

10. The electronic component bonding machine of claim 1 wherein the computer analyzes a frequency spectrum of the recombined optical signal to determine the distance between the upper target and the lower target.

11. The electronic component bonding machine of claim 1 wherein the electronic component bonding machine is a die attach machine.

12. The electronic component bonding machine of claim 1 wherein the electronic component bonding machine is a flip chip bonding machine.

13. The electronic component bonding machine of claim 1 wherein the electronic component bonding machine is a thermocompression bonding machine.

14. An electronic component bonding machine comprising:

a support structure for supporting a substrate;

a bond head assembly for holding an electronic component, and for bonding the electronic component to the substrate; and a measuring system for measuring a profile related to parallelism between (i) an upper target on the electronic component bonding machine and (ii) a lower target on the electronic component bonding machine, the upper target including a portion of the bond head assembly or the electronic component, the lower target including a portion of the support structure or the substrate, the measuring system including (a) an optical source for providing an optical signal, (b) an optical assembly connected to the optical source, the optical assembly including an optical element for splitting the optical signal into an upper optical signal directed toward the upper target and a lower optical signal directed toward the lower target, the optical assembly providing a recombined optical signal, the recombined optical signal including the lower optical signal reflected from the lower target and the upper optical signal reflected from the upper target, (c) an optical sensor connected to the optical assembly for receiving the recombined optical signal from the optical assembly, and (d) a computer in communication with the optical sensor to determine the profile using a plurality of distances measured using the recombined optical signal at a plurality of XY locations of the electronic component bonding machine.

15. A method of measuring a profile related to parallelism on an electronic component bonding machine, the method comprising the steps of:

(a) splitting an optical signal using an optical element of an optical assembly, the optical signal being split into an upper optical signal directed toward an upper target of an electronic component bonding machine and a lower optical signal directed toward a lower target of the electronic component bonding machine, the upper target including a portion of a bond head assembly of the electronic component bonding machine or an electronic component carried by the bond head assembly, the lower target including a portion of a support structure of the electronic component bonding machine or a substrate supported by the support structure;

(b) receiving, at an optical sensor, a recombined optical signal, the recombined optical signal including the upper optical signal reflected from the upper target and the lower optical signal reflected from the lower target, the recombined optical signal having been recombined by the optical assembly;

(c) analyzing the recombined optical signal to determine a distance between the upper target and the lower target; and (d) determining the profile using a plurality of distances measured using the recombined optical signal at a plurality of XY locations of the electronic component bonding machine.

16. The electronic component bonding machine of claim 1 wherein the optical assembly splits the optical signal such that the upper optical signal is directed along a path that is nominally 180 degrees from a path of the lower optical signal.

17. The method of claim 15 further comprising a step of (e) adjusting an angle between the upper target and the lower target.

* * * * *